(12) United States Patent
Choi et al.

(10) Patent No.: US 8,461,916 B2
(45) Date of Patent: Jun. 11, 2013

(54) FILTER CIRCUIT AND INTEGRATED CIRCUIT INCLUDING THE SAME

(75) Inventors: Hae-Rang Choi, Gyeonggi-do (KR); Young-Ju Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 42 days.

(21) Appl. No.: 12/981,161

(22) Filed: Dec. 29, 2010

(65) Prior Publication Data

US 2012/0112824 A1    May 10, 2012

(30) Foreign Application Priority Data

Nov. 4, 2010    (KR) .................. 10-2010-0109033

(51) Int. Cl.
    *H03K 5/00*    (2006.01)
(52) U.S. Cl.
    USPC ........................................... 327/551; 327/34
(58) Field of Classification Search
    USPC ............................................ 327/551–559, 34
    See application file for complete search history.

(56) References Cited

U.S. PATENT DOCUMENTS

| 5,894,495 | A | * | 4/1999 | Kase ............................. 375/232 |
| 5,970,094 | A | * | 10/1999 | Lee ............................... 375/236 |
| 6,681,059 | B1 | * | 1/2004 | Thompson .................... 382/298 |
| 6,745,218 | B1 | * | 6/2004 | Yamamoto et al. ........... 708/322 |
| 2007/0047686 | A1 | | 3/2007 | Aoki et al. |

FOREIGN PATENT DOCUMENTS

| KR | 101998060774 | 10/1998 |
| KR | 1020000044687 | 7/2000 |

OTHER PUBLICATIONS

Notice of Allowance issued by the Korean Intellectual Property Office on Jan. 4, 2012.

* cited by examiner

*Primary Examiner* — Dinh T. Le
(74) *Attorney, Agent, or Firm* — IP & T Group LLP

(57) ABSTRACT

A filter circuit includes a plurality of shifting units configured to each store an initial value, receive at least one input signal, and shift the stored value to a next shifting unit in sequence from among the shifting units in response to at least one input signal, and an initial value setting unit configured to set the initial stored values of the shifting units to different sets of initial stored values in response to different filter setting signals, respectively, wherein the different filter setting signals represent respectively different criteria for filtering the at least one input signal, wherein the initially stored values have a first logic value or a second logic value, wherein the filter circuit is configured to activate an output signal when the first logic value is shifted to a selected shifting unit among the plurality of shifting units.

19 Claims, 8 Drawing Sheets

FILTER CIRCUIT AND INTEGRATED CIRCUIT INCLUDING THE SAME

CROSS-REFERENCE TO RELATED APPLICATIONS

The present application claims priority of Korean Patent Application No. 10-2010-0109033, filed on Nov. 4, 2010, which is incorporated herein by reference in its entirety.

BACKGROUND OF THE INVENTION

Exemplary embodiments of the present invention relate to a filter design technology, and more particularly, to a filter circuit and an integrated circuit including the same.

According to an example, a moving average filter calculates an average value of a plurality of input signals and outputs the average value as an output signal. The moving average filter removes high frequency elements included in the input signals by the averaging operation. Thus, the moving average filter is used as a low pass filter and to average the previous output signals in a circular filtering algorithm, where an infinite impulse response of the moving average filter is obtained.

FIG. 1 is a diagram illustrating a conventional filter circuit.

As shown in FIG. 1, the conventional filter circuit includes a plurality of shifting units 110, 111A to 115A, and 111B to 115B, a first selecting unit 120 and a second selecting unit 130.

Hereinafter, an integration method filter, a proportional method filter, and a "depth" of the filter are described.

The integration method filter generates an output signal OU or OUT2 when a difference between a number of input times K1 of a first input signal IN1 and a number of input times K2 of a second input signal IN2 becomes a first desired value. More particularly, when K1 is larger than K2 by the first value, the first output signal OUT1 is generated, and when K2 is larger than K1 by the first value, the second output signal OUT2 is generated.

The proportional method filter generates an output signal OUT1 or OUT2 according to a first consecutive input times L1 of the first input signal IN1 and a second consecutive input times L2 of the second input signal IN2. More particularly, when L1 becomes a second desired value, the first output signal OUT1 is generated, and when L2 becomes the second value, the second output signal OUT2 is generated.

The "depth" of the filter refers to the first value used in the integration method filter or the second value used in the proportional method filter.

Referring to FIG. 1, operations of the integration method filter are as follows.

When the filter circuit is initialized, '1' is stored in a center shifting unit 110 and '0's are stored in other shifting units (111A to 115A and 111B to 115B).

When the first input signal IN1 is inputted, the plurality of shifting units 110, 111A to 115A, and 111B to 115B shift the stored value in a first direction 101, and when the second input signal IN2 is inputted, the plurality of shifting units 110, 111A to 115A, and 111B to 115B shift the stored value in a second direction 102.

The first selecting unit 120 selects one of the output signals UOUT0 to UOUT4 from the upper shifting units 111A to 115A) as a first output signal OUT1 based on the depth of the filter. The second selecting unit 130 selects one of the output signals DOUT0 to DOUT4 from the lower shifting units 111B to 115B) as a second output signal OUT2 based on the depth of the filter.

The first and second selecting units 120 and 130 each select an output signal in response to a depth information SEL. The depth information SEL may be a digital signal of at least 1 data bit that represents a depth of a filter circuit, where the depth is not greater than the maximum value of the depth.

For example, when the depth is 3, the first selecting unit 120 selects a third upper output signal UOUT<2> as the first output signal OUT1, and the second selecting unit 130 selects a third lower output signal DOUT<2> as the second output signal OUT2. When a value obtained by subtracting K2 from K1 becomes 3, the third upper output signal UOUT<2> is '1', and the first output signal OUT1 is activated. When a value obtained by subtracting K1 from K2 becomes 3, the third lower output signal DOUT<2> in the second direction 102 is '1', and the second output signal OUT2 is activated.

The first selecting unit 120 may be formed of a multiplexer that selects one of the output signals UOUT<0> to UOUT<4> as the first output signal OUT1 in response to the depth information SEL. The second selecting unit 130 may be formed to have the same structure as the first selecting unit 120.

The filter circuit removes noise included in the input signals IN1 and IN2 through the above operations. Even if the second input signal is inputted while the first input signals IN1 are consecutively inputted, an output is not outputted unless a difference between K2 and K1 is equal to the depth of the filter. Thus, noise may be removed. That is, the filter circuit may remove noise unless the same noise occurs more than a desired number of times.

The maximum of the depth is determined by the number of shifting units 111A to 115A connected in the first direction 101 or the number of shifting units 111B to 115B connected in the second direction 102. As shown in FIG. 1, the number of shifting units connected in the first direction 101 or the number of shifting units connected in the second direction is 5, and the maximum of the depth is 5. Therefore, the depth of the filter may be set from 1 to 5.

However, the first selecting unit 120 and the second selecting unit 130 are formed of multiplexer. As the maximum of the depth is increased, the number of multiplexer's inputs is increased. Thus, the filter circuit becomes complex and occupies large area, and output load thereof is increased due to a numbers of logic gate stages. As output load increase, the level of the output signal OUT1 or OUT2 decrease. Therefore, the size and the current consumption of a buffer (not shown in FIG. 1) may increase to compensate the level of the output signal OUT1 or OUT2.

SUMMARY OF THE INVENTION

Exemplary embodiments of the present invention are directed to a filter circuit which is capable of reducing circuit area and load with a simple structure in spite of an increase in a maximum of the depth of the filter circuit.

In accordance with an exemplary embodiment of the present invention, a filter circuit includes a plurality of shifting units configured to each store an initial value, receive at least one input signal, and shift the stored value to a next shifting unit in sequence from among the shifting units in response to at least one input signal and an initial value setting unit configured to set the initial stored values of the shifting units to different sets of initial stored values in response to different filter setting signals, respectively, wherein the different filter setting signals represent respectively different criteria for filtering the at least one input signal, wherein the initially stored values have a first logic value or a second logic value, wherein the filter circuit is configured to activate an output signal when the first logic value is shifted to a selected shifting unit among the plurality of shifting units.

In accordance with another exemplary embodiment of the present invention, a filter circuit includes a plurality of shifting units configured to each store an initial value, receive at least one input signal, and shift the stored value to a next shifting unit in sequence from among the shifting units in a first direction or a second direction of the sequence in response to at least one input signal and an initial value setting unit configured to set the initial stored values of the shifting units to different sets of initial stored values in response to different filter setting signals, respectively, wherein the different filter setting signals represent respectively different criteria for filtering the at least one input signal, wherein the initially stored values have a first logic value or a second logic value, wherein the filter circuit is configured to generate a first output signal when the first logic value is shifted to a first shifting unit among the plurality of shifting units and generate a second output signal when the first logic value is shifted to a second shifting unit among the plurality of shifting units.

In accordance with yet another exemplary embodiment of the present invention, an integrated circuit includes a detecting block configured to generates at least one detection signal, a filtering block configured to include a plurality of shifting units, wherein the shifting units are each configured to store an initial value, receive at least one detection signal, and shift the stored value to a next shifting unit in sequence from among the shifting units in a first direction or a second direction of the sequence in response to the at least one detection signal, and wherein the filter block is further configured to set the initial stored values of the shifting units to different sets of initial stored values in response to different filter setting signals, respectively and an operating block configured to perform operations in response to an output signal of the filtering block.

DESCRIPTION OF SPECIFIC EMBODIMENTS

Figure 1:
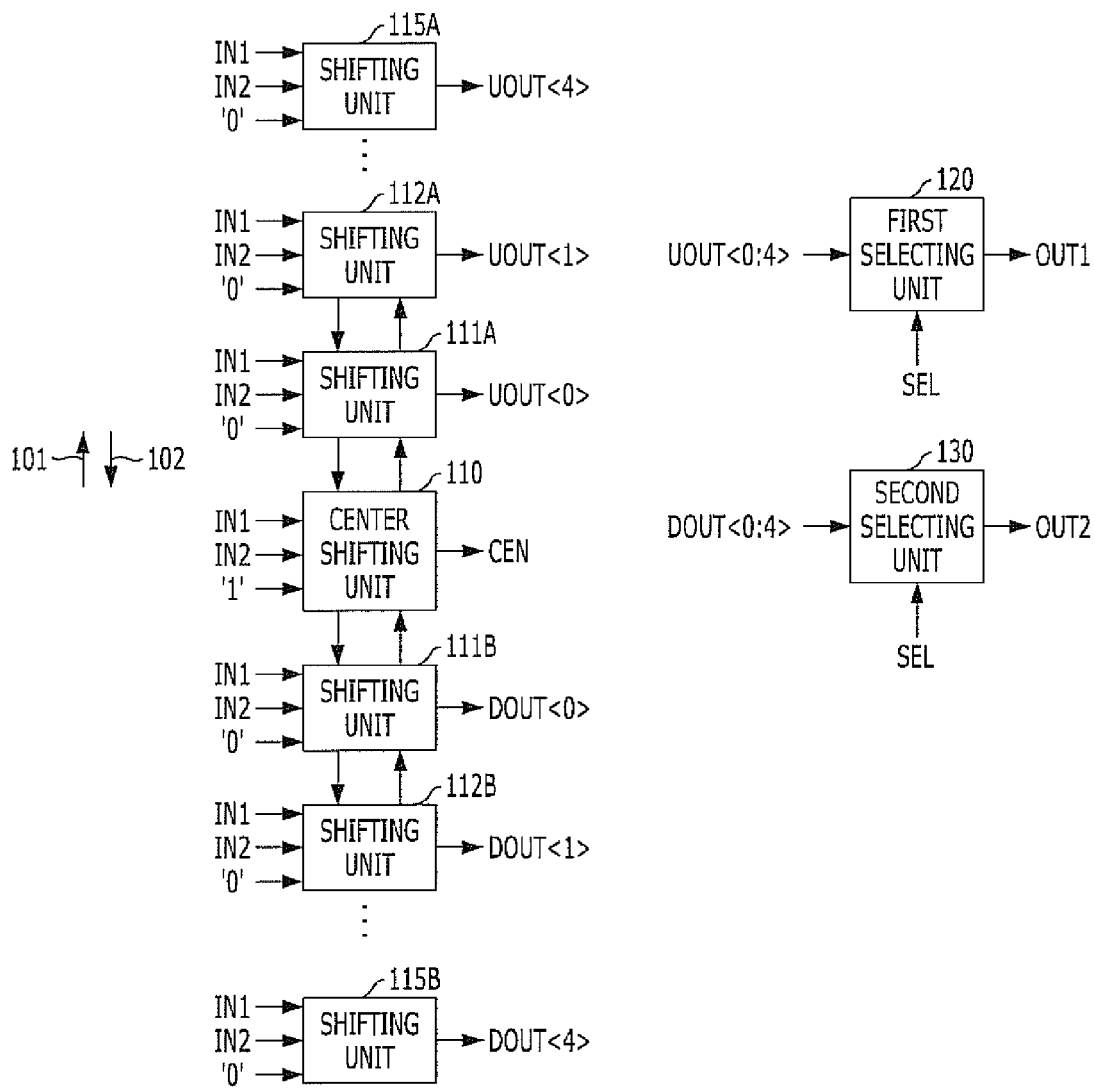
FIG. 1 is a diagram illustrating a conventional filter circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
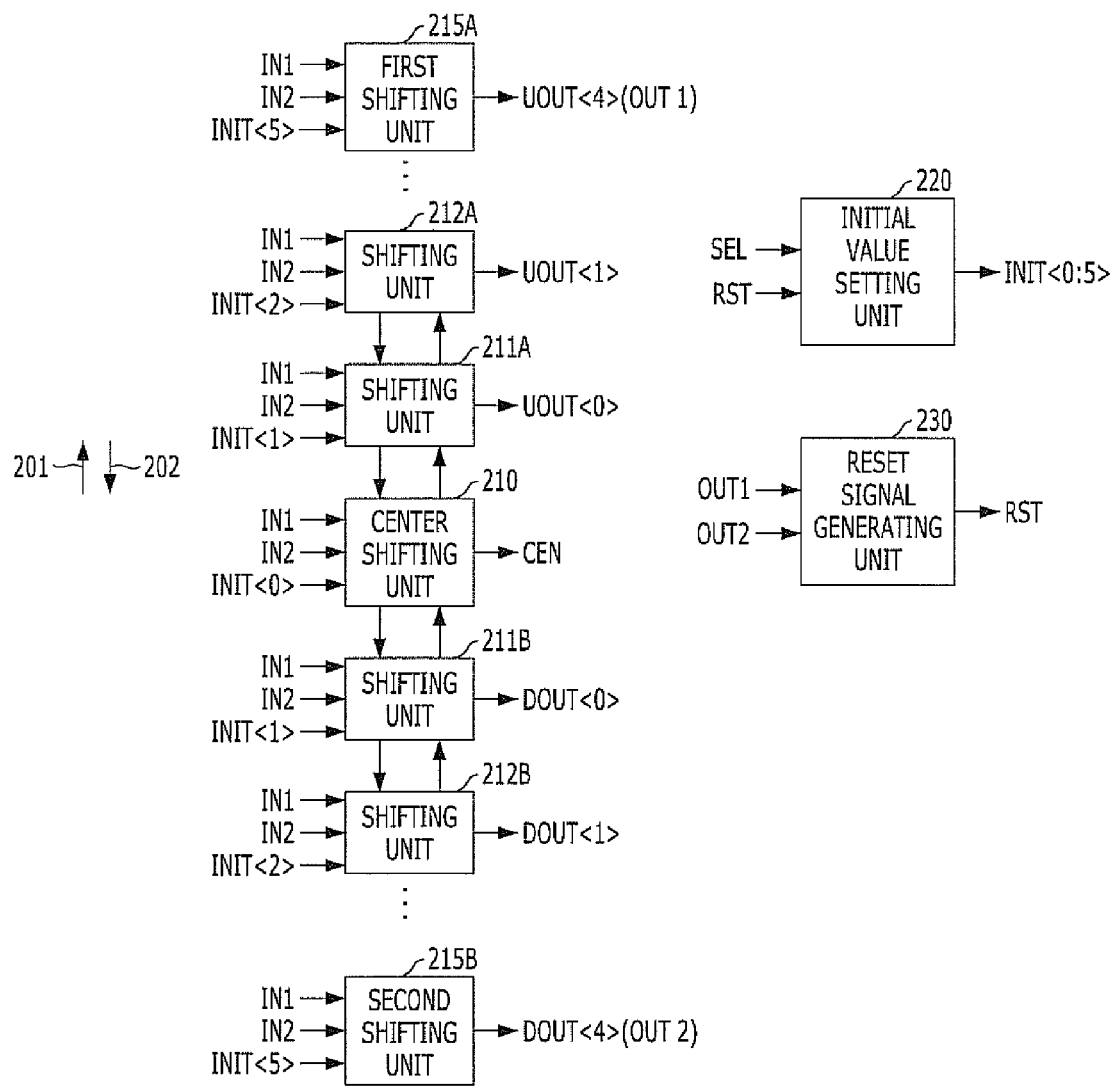
FIG. 2 is a diagram illustrating a filter circuit in accordance with a first exemplary embodiment of the present invention.

FIG. 2 is a diagram illustrating a filter circuit in accordance with a first exemplary embodiment of the present invention. The filter circuit shown in FIG. 2 is an integration method filter.

Referring to FIG. 2, the filter circuit includes a plurality of shifting units 210, 211A to 215A, and 211B to 215B, an initial value setting unit 220, and a reset signal generating unit 230.

The plurality of shifting units 210, 211A to 215A, and 211B to 215B are configured to shift the stored value in a first direction 201 in response to a first input signal IN1, and configured to shift the stored value in a second direction 202 in response to a second input signal IN2.

The initial value setting unit 220 is configured to set initial values INIT<0:5> which stored in the plurality of shifting units 210, 211A to 215A, and 211B to 215B as an initial value based on a depth of the filter. As shown in FIG. 2, a first initial value INIT<0> is stored in a center shifting unit 210, a second initial value INIT<1> is stored in the shifting units 211A and 211B, a third initial value INIT<2> is stored in the shifting units 212A and 212B, a fourth initial value INIT<3> is stored in the shifting units 213A and 213B, a fifth initial value INIT<4> is stored in the shifting units 214A and 214B, and a sixth initial value INIT<5> is stored in a first shifting unit 215A and a second shifting unit 215B.

The reset signal generating unit 230 is configured to generate a reset signal RST in response to output signals OUT1 and OUT2.

Hereinafter, the operations of filter circuit are described.

When the reset signal RST is activated, the initial value setting unit 220 determines the initial values INIT<0:5> by decoding a depth information SEL. Based on the depth information SEL, parts of the initial values INIT<0:5> stored in the shifting units 210, 211A to 215A, and 211B to 215B are activated and the rest of the initial values are inactivated. Here, the active initial value is defined as '1' and the inactive initial value is defined as '0'. However, opposite definitions may be possible. The depth information SEL is a signal of at least 1 data bit that may represent different criteria for filtering an input signal including a depth of a filter circuit, where the depth is not greater than the maximum value of the depth. The filter is configured to filter signals differently depending on different depth signals.

When the first input signal IN1 is inputted, stored values in the shifting units 210, 211A to 215A, and 211B to 215B are shifted in the first direction 201. When the second input signal IN2 is inputted, stored values in the shifting units 210, 211A to 215A, and 211B to 215B are shifted in the second direction 202.

Depending on the stored location of the active initial value '1' in the shifting units, the number of shifting units through which '1' is to be shifted to reach a selected shifting unit such as the first shifting unit 215A or another selected shifting unit such as the second shifting unit 215B is changed.

For example, when the depth of the filter is 3 and the first shifting unit 215A and the second shifting unit 215B are selected shifting units, '1' is to be shifted through 3 shifting units to reach the first shifting unit 215A or the second shifting unit 215B. That is, the initial values INIT<0:2> are determined as '1' and the initial values INIT<3:5> are determined as '0' so that '1' is shifted through the shifting units 213A, 214A, and 215A in the first direction 201 and the shifting units 213B, 214B, and 215B in the second direction 202 before being output. Also, only the third initial value INIT<2> may be determined as '1'.

Furthermore, the first shifting unit may be any one of shifting units 211A to 215A located from the center shifting unit 210 in the first direction 201, and the second shifting unit may be any one of shifting units 211B to 215B located from the center shifting unit 210 in the second direction 202.

When the difference between the input times of the first input signal IN1 and the input times of the second input signal IN2 becomes 3, '1' reaches the first shifting unit 215A or the second shifting unit 215B. When '1' reaches the first shifting unit 215A, the first output signal OUT1 is generated, and when '1' reaches the second shifting unit 215B, the second output signal OUT2 is generated.

When the first output signal OUT1 or the second output signal OUT2 is activated, the reset signal generating unit 230 activates the reset signal RST. When the reset signal RST is activated, the initial value setting unit 220 activates parts of the initial values INIT<0:5> stored in the shifting units 210, 211A to 215A, and 211B to 215B and inactivates the rest of the initial values in response to the depth information SEL as described above.

Meanwhile, the depth in the first direction 201 and the depth in the second direction 202 may not be the same. The first shifting unit 215A and the second shifting unit 215B may be determined differently, or the initial values stored in the shifting units 211A to 215A may be set differently from the initial values stored in the shifting units 211B to 215B.

In accordance with the first embodiment of the present invention, the first shifting unit 215A for generating the first output signal OUT1 and the second shifting unit 215B for generating the second output signal OUT2 are determined, and the activated initial value are stored in the shifting units based on the depth. According to an example, the shifting units for generating the output signals OUT1 and OUT2 are not selected, and the selecting units 120 and 130 are optional. Although the maximum of the depth increases, the number of logic gate stages is not increased and the circuit load is not increased. Therefore, the size and the current consumption of a buffer (not shown in FIG. 2) are not greatly increased in order to compensate a decrease in the level of the output signal due to an increase of the load. Also, the filter circuit has a simple structure since the multiplexer is optional.

Furthermore, a filter circuit in accordance with another embodiment of the present invention may include a plurality of shifting units 210, 211A to 215A, and 211B to 215B, an initial value setting unit 220, and a reset signal generating unit 230. The plurality shifting units 210, 211A to 215A, and 211B to 215B are configured to shift the stored value in a first direction 201 or in a second direction 202 in response to input signals IN1 and IN2. The initial value setting unit 220 is configured to set each of initial values INIT<0:5> stored in each of shifting units 210, 211A to 215A, and 211B to 215B according to a depth. The resetting signal generating unit 230 is configured to active a reset signal RST in response to an output signal OUT1.

That is, the filter circuit in accordance with another embodiment of the present invention is a unidirectional filter circuit performing a filtering operation in the first direction 201, which does not perform a filtering operation in the second direction 202. The filter circuit generate the output signal OUT1 when an active initial value among the initial values INIT<0:5> reaches a first shifting units 215A. Operations of the unidirectional filter circuit are the same as those of the filter circuit described in FIG. 2 having the above-described first and second directional operations except that the unidirectional filter circuit does not operate in two directions.

Figure 3A:
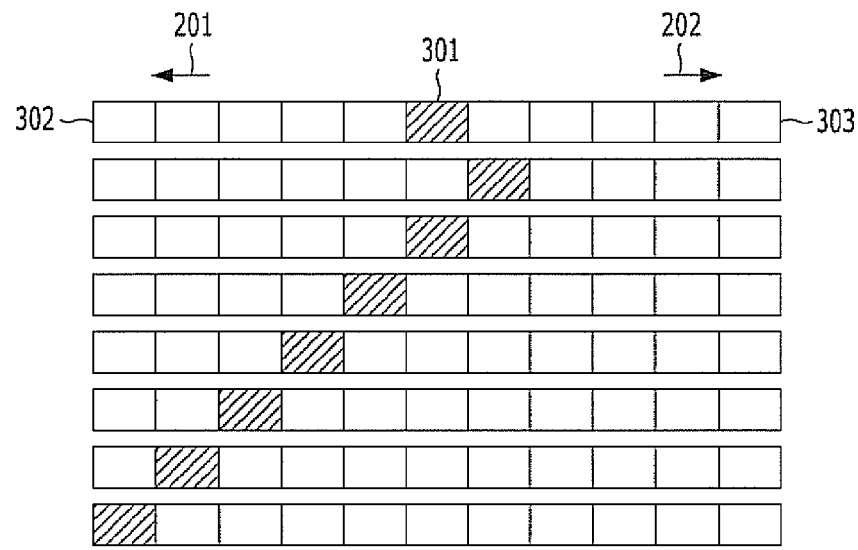
FIGS. 3A to 3C are diagrams illustrating operation of the filter circuit in accordance with the first exemplary embodiment of the present invention.
Figure 3B:
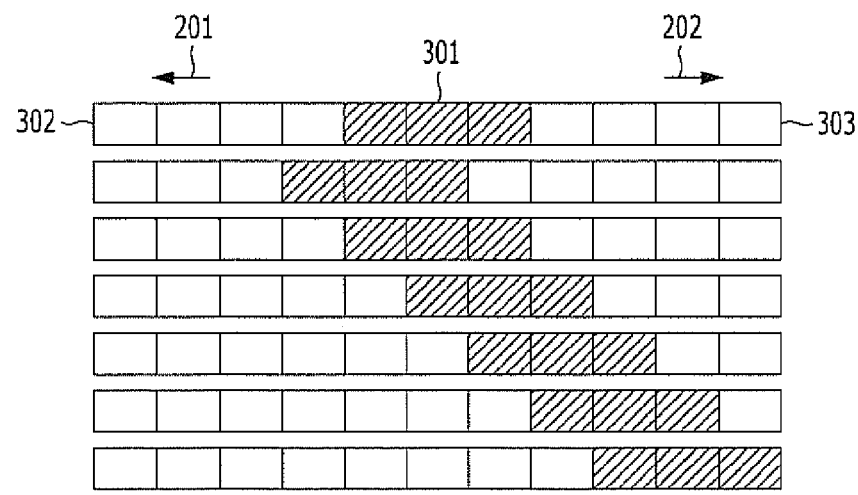
Figure 3C:
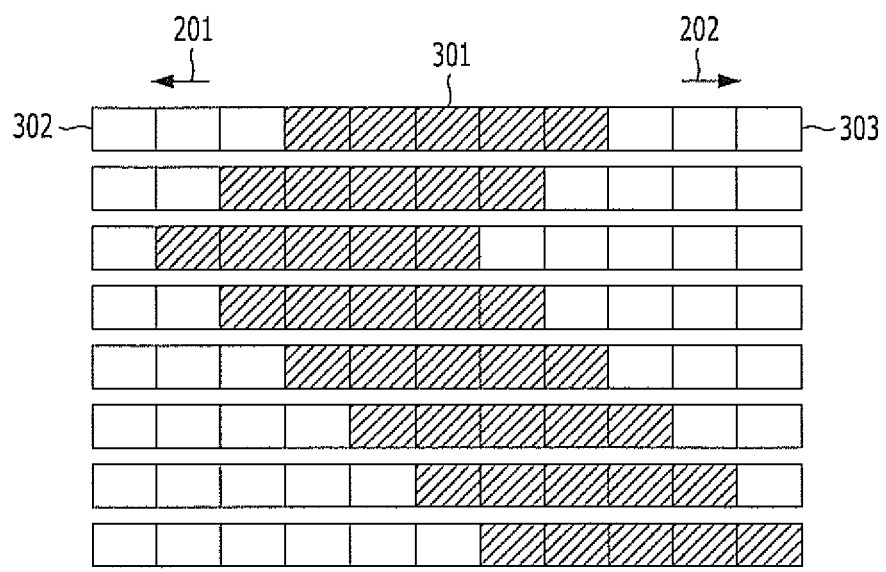

FIGS. 3A to 3C are diagrams illustrating operation of the filter circuit in accordance with the first exemplary embodiment of the present invention.

In each drawing, squares are corresponding to the shifting units 210, 211A to 215A, and 211B to 215B. More particularly, the squares of the reference numerals '301', '302', and '303' correspond to the center shifting unit 210, the first shifting unit 215A, and the second shifting unit 215B, respectively. Slashed squares represent the shifting units storing the active initial value '1', and empty squares represent the shifting units storing the inactive initial value '0'.

FIG. 3A represents operations of the filter circuit when the depth is 5.

As shown in FIG. 3A, the input signals IN1 and IN2 are inputted in sequence of IN2, IN1, IN1, IN1, IN1, IN1, and IN1. The first input times K1 of the first input signal IN1 is 6 and the second input times K2 of the second input signal IN2 is 1, and thus, the first output signal OUT1 is activated.

FIG. 3B represents operations of the filter circuit when the depth is 4.

As shown in FIG. 3B, the input signals IN1 and IN2 are inputted in sequence of IN1, IN2, IN2, IN2, IN2, and IN2. The first input times K1 of the first input signal IN1 is 1 and the second input times K2 of the second input signal IN2 is 5, and thus, the second output signal OUT2 is activated.

FIG. 3C represents operations of the filter circuit when the depth is 3.

As shown in FIG. 3C, the input signals IN1 and IN2 are inputted in sequence of IN1, IN1, IN2, IN2, IN2, IN2, and IN2. The first input times K1 of the first input signal IN1 is 2 and the second input times K2 of the second input signal IN2 is 5, and thus, the second output signal OUT2 is activated.

Figure 4:
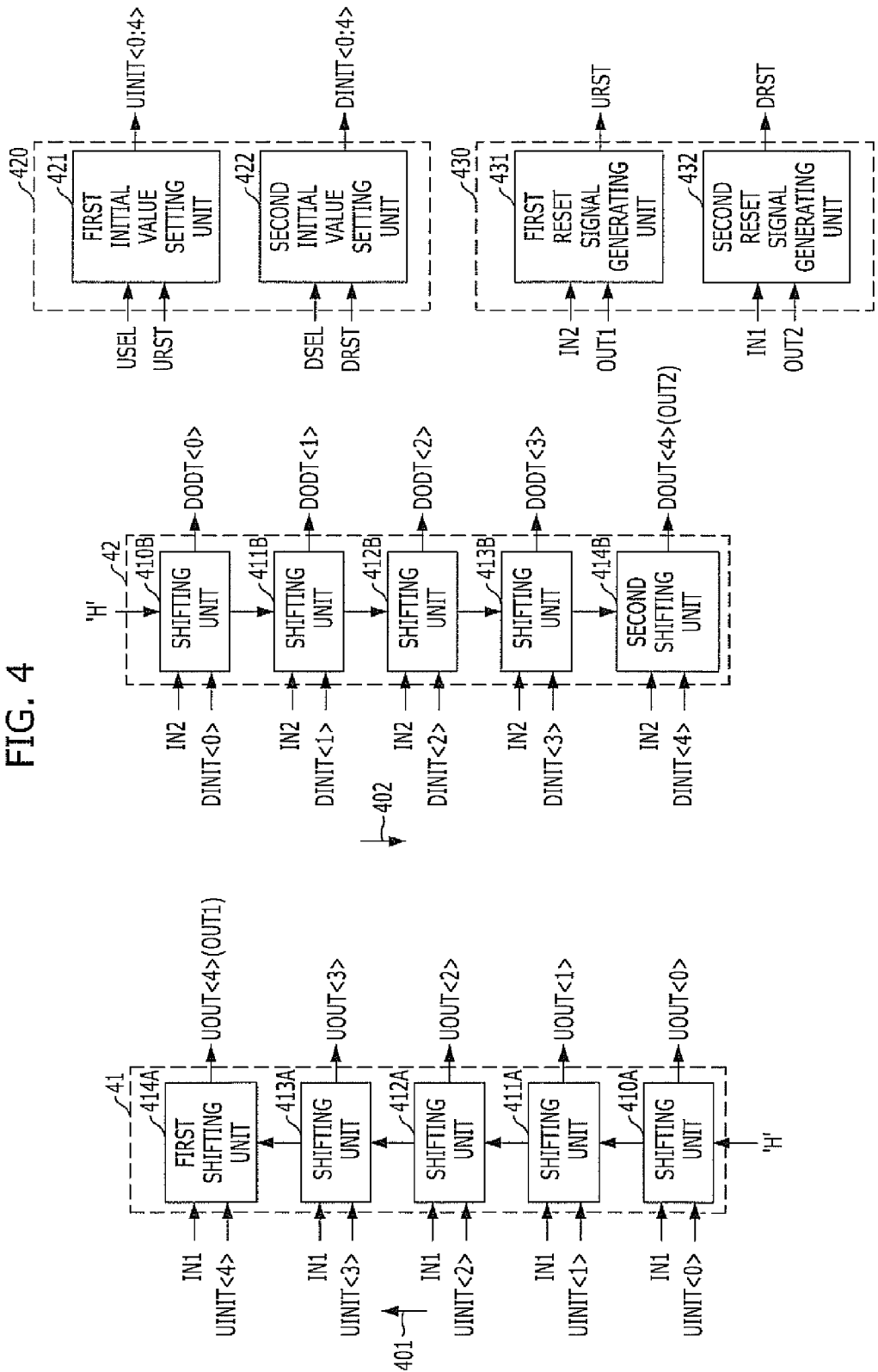
FIG. 4 is a diagram illustrating a filter circuit in accordance with a second exemplary embodiment of the present invention.

FIG. 4 is a diagram illustrating a filter circuit in accordance with a second exemplary embodiment of the present invention. The filter circuit shown in FIG. 4 is a proportional method filter.

Referring to FIG. 4, the filter circuit includes a first shifting block 41, a second shifting block 42, an initial value setting block 420 and a reset signal generating block 430.

The first shifting block 41 includes a plurality of shifting units 410A to 414A. The plurality of shifting units 410A to 414A are configured to shift the stored value in a first direction 401 in response to a first input signal IN1. The second shifting block 42 includes a plurality of shifting units 410B to 414B. The plurality of shifting units 410B to 414B are configured to shift the stored value in a second direction 402 in response to a second input signal IN2.

The initial value setting block 420 includes a first initial value setting unit 421 and a second initial value setting unit 422. The first initial value setting unit 421 is configured to set first initial values UINIT<0:4> which stored in the plurality of first shifting units 410A to 414A based on a depth. The second initial value setting unit 422 is configured to set second initial values DINIT<0:4> which are stored in the plurality of second shifting units 410B to 414B based on the depth.

In the first shifting block 41, UINIT<0> is stored in the shifting unit 410A, UINIT<1> is stored in the shifting unit 411A, UINIT<2> is stored in the shifting unit 412A, UINIT<3> is stored in the shifting unit 413A, and UINIT<4> is stored in a first shifting unit 414A. In the second shifting block 42, DINIT<0> is stored in the shifting unit 410B, DINIT<1> is stored in the shifting unit 411B, DINIT<2> is stored in the shifting unit 412B, DINIT<3> is stored in the shifting unit 413B, and DINIT<4> is stored in a second shifting unit 414B.

The reset signal generating block 430 includes a first reset signal generating unit 431 and a second reset signal generating unit 432. The first reset signal generating unit 431 is configured to generate a first reset signal URST in response to a first output signal OUT1. Also, the second reset signal generating unit 432 is configured to generate a second reset signal DRST in response to a second output signal OUT2.

Hereinafter, the operations of filter circuit are described.

When the first reset signal URST is activated, the first initial value setting unit 421 sets the first initial values UINIT<0:4> by decoding a first depth information USEL. When the second reset signal DRST is activated, the second initial value setting unit 422 sets the second initial values DINIT<0:4> by decoding a second depth information DSEL. Based on the first depth information USEL and the second depth information DSEL, parts of the initial values UINIT<0:4> and DINIT<0:4> stored in the shifting units 410A to 414A and 410B to 414B are activated and the rest of the initial values are inactivated. Here, the active initial value is defined as '1' and the inactive initial value is defined as '0'. However, opposite definitions may be possible.

The depth information USEL or DSEL is a signal having more than 1 data bit that represents a depth a filter circuit, where the depth is not greater than the maximum value of the depth. Hereinafter, it is assumed that the first depth information USEL is the same as the second depth information DSEL.

The stored values in the shifting units 410A to 414A of the first shifting block 41 are shifted in the first direction 401 whenever the first input signal IN1 is inputted, and the stored values in the shifting units 410A to 414A are initialized when the second input signal IN2 is inputted. Also, the stored values in the shifting units 410B to 414B of the second shifting block 42 are shifted in the second direction 402 whenever the second input signal IN2 is inputted, and the stored values in the shifting units 410B to 414B are initialized when the first input signal IN1 is inputted.

According to the location of '1' stored in the shifting units, the number of shifting units through which '1' is to be shifted in the first direction 401 to reach the first shifting unit 414A or the number of shifting units through which '1' is to be shifted in the second direction 402 to reach the second shifting unit 414B is changed.

For example, when the depth is 3, '1' is to be shifted through three shifting units to reach the first shifting unit 414A or the second shifting unit 414B. That is, '1' is set to be shifted through the shifting units 412A, 413A, and 414A in the first direction 201 or '1' is set to be shifted the shifting units 412B, 413B, and 414B in the second direction 202. Therefore, the initial values UINIT<0:1> and DINIT<0:1> are determined as '1' and the initial values UINIT<2:4> and DINIT<2:4> are determined as '0'. Also, only UINIT<1> and DINIT<1> may be determined as '1'.

When the consecutive input times of the first input signal IN1 becomes 3 or the consecutive input times of the second input signal IN2 becomes 3, '1' reaches the first shifting unit 414A or the second shifting unit 414B. When '1' reaches the first shifting unit 414A, the first output signal OUT1 is generated, and when '1' reaches the second shifting unit 414B, the second output signal OUT2 is generated.

If the first output signal OUT1 is activated, the first reset signal generating unit 431 activates the first reset signal URST. When the first reset signal URST is activated, the first initial value setting unit 421 sets the first initial values UINIT<0:4> in response to the first depth information USEL as described above. If the second output signal OUT2 is activated, the second reset signal generating unit 432 activates the second reset signal DRST. When the second reset signal DRST is activated, the second initial value setting unit 422 sets the second initial values DINIT<0:4> in response to the second depth information DSEL as described above.

According to an example, any reasonably suitable input signal including but not limited to two input signals IN1 and IN2 may be used. When one input signal is used, shifting directions (401 and 402) may be changed in response to logic levels (low and high) of the input signal. Operations of the filter circuit using one input signal is the same as that of the filter circuit shown in FIG. 4 except that one input signal is used.

Furthermore, a filter circuit in accordance with another embodiment of the present invention may include a plurality of shifting units 410A to 414A, an initial value setting unit 421, and a reset signal generating unit 431. The plurality of shifting units 410A to 414A are configured to shift the stored value in response to an input signal IN1 in a first direction 401. The initial value setting unit 421 is configured to set each of initial values UINIT<0:4> stored in each of shifting units 410A to 414A according to a depth. The resetting signal generating unit 431 is configured to active a reset signal URST in response to an output signal OUT1 or another input signal IN2.

That is, the filter circuit in accordance with another embodiment of the present invention is a unidirectional filter circuit performing a filtering operation in the first direction 401, which does not perform a filtering operation in a second direction 402.

The filter circuit generate the output signal OUT1 when an active initial value among the initial values UINIT<0:4> reaches a certain shifting unit among the plurality of shifting units 410A to 414A. Principle of the unidirectional filter circuit is the same as that of the filter circuit shown in FIG. 4.

In a filter circuit in accordance with the second embodiment of the present invention, '1' ('H') signal may be consecutively inputted/shifted to the shifting units 410A and 410B during the shifting operation as shown in FIG. 4.

Figure 5A:
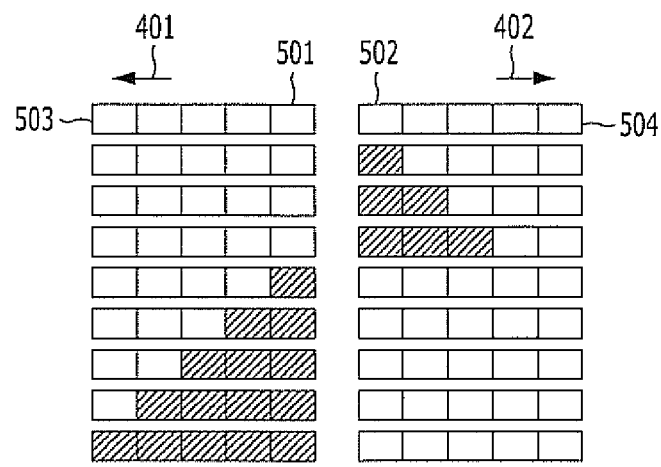
FIGS. 5A to 5C are diagrams illustrating operation of the filter circuit in accordance with the second exemplary embodiment of the present invention.
Figure 5B:
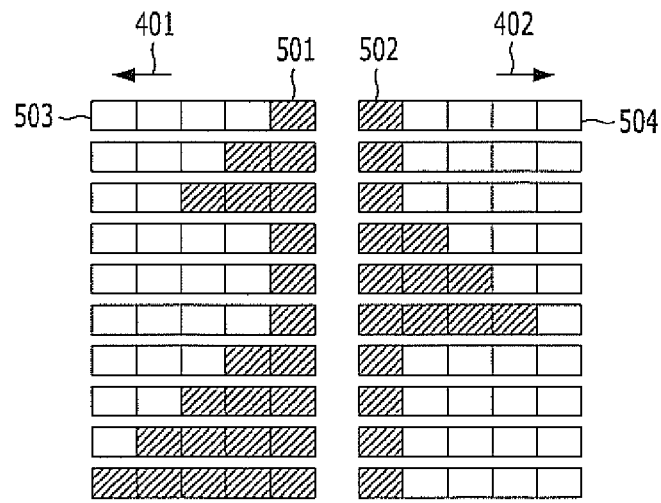
Figure 5C:
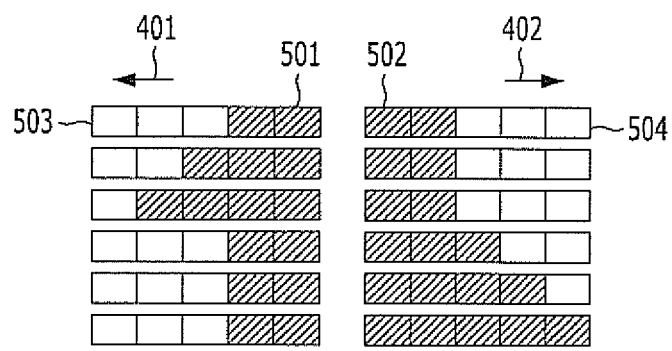

FIGS. 5A to 5C are diagrams illustrating operation of the filter circuit in accordance with the second exemplary embodiment of the present invention. More specifically, FIGS. 5A to 5C illustrate the operations of the filter circuit in a case that '1' signal is consecutively inputted through the shifting units 401A and 410B while the shifting operation is performed.

In each drawing, squares are corresponding to the shifting units 410A to 414A and 410B to 414B. More particularly, the squares of the reference numerals '501', '502', '503', and '504' correspond to the shifting unit 410A, the shifting unit 410B, the first shifting unit 414A, and the second shifting unit 414B, respectively. Slashed squares represent the shifting units storing the active initial value '1', and empty squares represent the shifting units storing the inactive initial value '0'.

FIG. 5A represents operations of the filter circuit when the depth is 5.

As shown in FIG. 5A, the input signals IN1 and IN2 are inputted in sequence of IN2, IN2, IN2, IN1, IN1, IN1, IN1, and IN1. The consecutive input times of the first input signal IN1 is 5, and thus, the first output signal OUT1 is activated.

FIG. 5B represents operations of the filter circuit when the depth is 4.

As shown in FIG. 5B, the input signals IN1 and IN2 are inputted in sequence of IN1, IN1, IN2, IN2, IN2, IN1, IN1, IN1, and IN1. The consecutive input times of the first input signal IN1 is 4, and thus, the first output signal OUT1 is activated.

FIG. 5C represents operations of the filter circuit when the depth is 3.

As shown in FIG. 5C, the input signals IN1 and IN2 are inputted in sequence of IN1, IN1, IN2, IN2, and IN2. The consecutive input times of the second input signal IN2 is 3, and thus, the second output signal OUT2 is activated.

Figure 6:
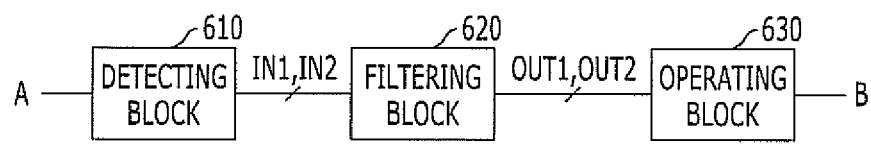
FIG. 6 is a diagram illustrating an integrated circuit in accordance with an embodiment of the present invention.

FIG. 6 is a diagram illustrating an integrated circuit in accordance with an embodiment of the present invention.

Referring to FIG. 6, the integrated circuit includes a detecting block 610, a filtering block 620 and an operating block 630.

The detecting block 610 is configured to receive an input value and output at least one detection signal, e.g., IN1 or IN2. The filtering block 620 is configured to receive the detection signals IN1 and IN2 and generate a first output signal OUT1 and a second output signal OUT2. The operating block 630 is configured to perform operations in response to the first output signal OUT1 or the second output signal OUT2.

The detection signals IN1 and IN2 are corresponding to input signals IN1 and IN2 of the filter circuit shown in FIGS. 2 and 4. When the integration method filter is used, the filtering block 620 has the same structure as the filter circuit of FIG. 2, and when the proportional method filter is used, the filtering block 620 has the same structure as the filter circuit of FIG. 4.

The detecting block 610 receives the input value through an input terminal A, compares the input value with a desired reference value and generates the detection signals IN1 and IN2. Then, when the filtering block 620 generates the output signals OUT1 and OUT2 in response to the detection signals IN1 and IN2, the operating block 630 controls its own operations in response to the output signals OUT1 and OUT2. The operating block 630 outputs the operation result through an output terminal B.

Figure 7:
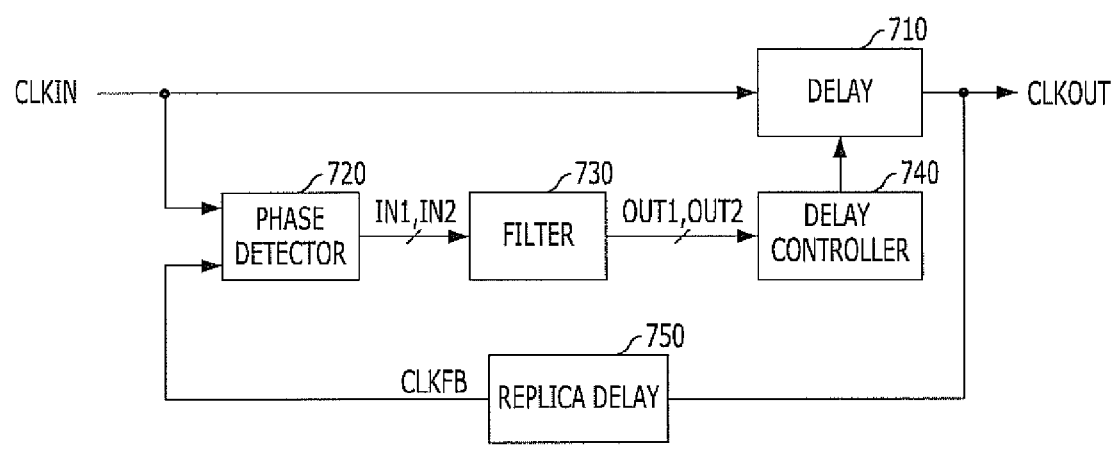
FIG. 7 is a diagram illustrating a delay locked loop including the integrated circuit in accordance with an embodiment of the present invention.

FIG. 7 is a diagram illustrating a delay locked loop including the integrated circuit in accordance with an embodiment of the present invention.

The delay locked loop includes a delay 710, a phase detector 720, a filter 730, a delay controller 740 and a replica delay 750.

The delay 710 is configured to delay an input clock CLKIN and generate an output clock CLKOUT. The replica delay 750 is configured to delay the output clock CLKOUT and generate a feedback clock CLKFB. The phase detector 720 is configured to compare phases between the input clock CLKIN and the feedback clock CLKFB and generate a detection signal IN1 or IN2.

The filter 730 is configured to remove noise included in the detection signal IN1 or IN2. The delay controller 740 is configured to control a delay value of the delay 710 in response to output signals OUT1 and OUT2 of the filter 730.

The phase detector 720 is corresponding to the detecting block 610 of FIG. 6. The phase detector 720 compares phases between the input clock CLKIN and the feedback clock CLKFB and generates the detection signal IN1 or IN2. For example, when the phase of the input clock CLKIN leads the phase of the feedback clock CLKFB, a first detection signal IN1 is generated. Also, when the phase of the feedback clock CLKFB leads the phase of the input clock CLKIN, a second detection signal IN2 is generated.

The filter 730 is corresponding to the filtering block 620 of FIG. 6. The filter 730 removes noise included in the detection signals IN1 and IN2, and generates the output signals OUT1 and OUT2.

Both the delay 710 and the delay controller 740 are corresponding to the operating block 630 of FIG. 6. The delay controller 740 controls the operations of the delay 710 in response to the output signals OUT1 and OUT2. For example, the delay controller 740 increases the delay value of the delay 710 in response to a first output signal OUT1, and the delay controller 740 decreases the delay value of the delay 710 in response to a second output signal OUT2.

The integrated circuit shown in FIG. 6 may be applied to not only the delay locked loop but also a signal process apparatus including a digital filter circuit and apparatuses having the digital filter used in a digital signal process DSP chip, for example.

As described above, the filter circuit in accordance with the first and second exemplary embodiments of the present invention is a simple structure although the maximum of the depth is increased. As a result, area and load of the filter circuit may be reduced.

While the present invention has been described with respect to the specific embodiments, it will be apparent to those skilled in the art that various changes and modifications may be made without departing from the spirit and scope of the invention as defined in the following claims.

What is claimed is:

1. A filter circuit comprising:
a plurality of shifting units configured to each store an initial value, receive at least one input signal, and sequentially shift the stored initial value to a next shifting unit, of the plurality of shifting units, in response to the at least one input signal; and
an initial value setting unit configured to receive different filter setting signals and a reset signal, set the stored initial values, of the plurality of shifting units, to different sets of stored initial values in response to the different filter setting signals, wherein the different filter setting signals represent different criteria for filtering the at least one input signal, wherein the stored initial values have a first logic value or a second logic value, and
wherein the filter circuit is configured to activate an output signal if the first logic value is shifted to a predetermined shifting unit among the plurality of shifting units.

2. The filter circuit of claim 1, wherein a number of shifting units, of the plurality of shifting units, through which the first logic value is shifted to reach the predetermined shifting unit, is changed in response to the different filter setting signals.

3. The filter circuit of claim 1, wherein a total number of shifting units, of the plurality of shifting units, in which the first logic value is initially stored is changed based on the different filter setting signals.

4. The filter circuit of claim 1, wherein a configuration of the filter circuit is based on the different filter setting signals.

5. The filter circuit of claim 1, wherein the initial value setting unit is configured to reset values stored in the plurality of shifting units to the stored initial values a in response to the reset signal.

6. The filter circuit of claim 5, further comprising a reset signal generating unit configured to activate the reset signal in response to the output signal.

7. The filter circuit of claim 6, wherein the reset signal generating unit is configured to activate the reset signal when the at least one input signal is deactivated.

8. A filter circuit comprising:
a plurality of shifting units configured to each store an initial value, receive at least one input signal, and sequentially shift, in a first direction or a second direction, the stored initial value to a next shifting unit, of the plurality of shifting units, in response to the at least one input signal; and
an initial value setting unit configured to receive different filter setting signals and a reset signal, set the stored initial values, of the plurality of shifting units, to different sets of stored initial values in response to the different filter setting signals, wherein the different filter setting signals represent different criteria for filtering the at least one input signal, wherein the stored initial values have a first logic value or a second logic value, and wherein the filter circuit is configured to generate a first output signal if the first logic value is shifted to a first shifting unit, among the plurality of shifting units, and generate a second output signal if the first logic value is shifted to a second shifting unit among the plurality of shifting units.

9. The filter circuit of claim 8, wherein the first shifting unit is one of the plurality of shifting units and is located in the first direction from a center shifting unit, of the plurality of shifting units, and the second shifting unit is one of the plurality of shifting units and is located in the second direction from the center shifting unit.

10. The filter circuit of claim 9, wherein the at least one input signal includes a first input signal or a second input signal and the plurality of shifting units shift the stored initial values in the first direction in response to the first input signal and shift the stored initial values in the second direction in response to the second input signal.

11. The filter circuit of claim 10, wherein a number of shifting units, of the plurality of shifting units, through which the first logic value is shifted to reach the first shifting unit or the second shifting unit is changed in response to the different filter setting signals.

12. The filter circuit of claim 8, wherein the initial value setting unit is configured to reset values stored in the plurality of shifting units to the initial values in response to the reset signal.

13. The filter circuit of claim 12, further comprising a reset signal generating unit configured to activate the reset signal in response to the first output signal or the second output signal.

14. An integrated circuit comprising:
a detecting block configured to generate at least one detection signal;
a filtering block configured to include a plurality of shifting units, wherein the plurality of shifting units are each configured to store an initial value, receive the at least one detection signal, and sequentially shift, in a first direction or a second direction, the stored initial value to a next shifting unit, of the plurality of shifting units, in response to the at least one detection signal, and wherein the filtering block further includes an initial value setting unit configured to receive different filter setting signals and a reset signal, set the initial stored values of the plurality of shifting units to different sets of initial stored values in response to the different filter setting signals; and an operating block configured to perform operations in response to an output signal of the filtering block.

15. The integrated circuit of claim 14, wherein the different filter setting signals represent different criteria for filtering the at least one input signal, and wherein the filtering circuit is configured to generate a first output signal if the first logic value is shifted to a first shifting unit, among the plurality of shifting units, and generate a second output signal if the first logic value is shifted to a second shifting unit among the plurality of shifting units.

16. The integrated circuit of claim 15, wherein the first shifting unit is one of the plurality of shifting units, and is located in the first direction from a center shifting unit, of the plurality of shifting units, and the second shifting unit is one of the plurality of shifting units and is located in the second direction from the center shifting unit.

17. The integrated circuit of claim 16, wherein the at least one detection signal includes a first detection signal or and a second detection signal, and the plurality of shifting units shift the stored initial values in the first direction in response to the first detection signal and shift the stored initial values in the second direction in response to the second detection signal.

18. The integrated circuit of claim 15, wherein a number of shifting units, of the plurality of shifting units, through which the first logic value is shifted to reach the first shifting unit or the second shifting unit is changed in response to the different filter setting signals.

19. The integrated circuit of claim 14, wherein the initial value setting unit is configured to reset values stored in the plurality of shifting units to the initial values a in response to the reset signal.

* * * * *